United States Patent

Cetel et al.

Patent Number: 5,068,084
Date of Patent: Nov. 26, 1991

[54] COLUMNAR GRAIN SUPERALLOY ARTICLES

[75] Inventors: Alan D. Cetel, West Hartford; David N. Duhl, Newington, both of Conn.

[73] Assignee: United Technologies Corporation, Hartford, Conn.

[21] Appl. No.: 815,608

[22] Filed: Jan. 2, 1986

[51] Int. Cl.⁵ .............................................. C22C 19/05
[52] U.S. Cl. ............................... 420/443; 420/445; 420/446; 420/447; 420/448; 420/449; 420/450
[58] Field of Search ............... 420/443, 448, 445, 446, 420/447, 449, 450

[56] References Cited

U.S. PATENT DOCUMENTS

| | | | |
|---|---|---|---|
| 3,293,030 | 12/1966 | Child et al. | 420/449 |
| 3,526,499 | 9/1970 | Quigg et al. | 75/171 |
| 3,681,061 | 8/1972 | Fletcher | 420/449 |
| 3,711,337 | 1/1973 | Sullivan et al. | 148/32.5 |
| 3,765,879 | 10/1973 | Hockin et al. | 420/448 |
| 4,006,012 | 2/1977 | Kadlimann | 420/449 |
| 4,043,841 | 8/1977 | Bibring et al. | 420/448 |
| 4,083,734 | 4/1978 | Boesch | 420/449 |
| 4,093,454 | 6/1978 | Saito et al. | 420/449 |
| 4,116,723 | 9/1978 | Gell et al. | 148/3 |
| 4,209,348 | 6/1980 | Duhl et al. | 148/3 |
| 4,222,794 | 9/1980 | Schweizer et al. | 148/3 |
| 4,279,645 | 7/1981 | Brown | 420/449 |
| 4,374,084 | 2/1983 | Meethan et al. | 420/449 |
| 4,388,124 | 6/1983 | Henry | 148/404 |

*Primary Examiner*—Stephen J. Lechert, Jr.
*Attorney, Agent, or Firm*—Charles E. Sohl

[57] ABSTRACT

An article exhibiting superior mechical properties and resistance to oxidation corrosion at elevated temperatures as described. The article has particular utility in gas turbine engines and is comprised of a nickel base superalloy consisting essentially of 3-10% Cr, 12.1-16% Co, 1.0-1.9% Mo, 3-10% W, 0-5% Re, 4-7% Al, 0-1.5% Ti, 0-8% Ta, 0.5-3% Hf, 0-2% Cb, 0-1% V, 0.02-0.12% Zr, 0.03-0.2% C, 0.005-0.25% B, 0-0.15% of an oxygen active element such as yttrium, balance essentially nickel. This composition is melted and directionally solidified in columnar grain form to provide useful articles.

8 Claims, 3 Drawing Sheets

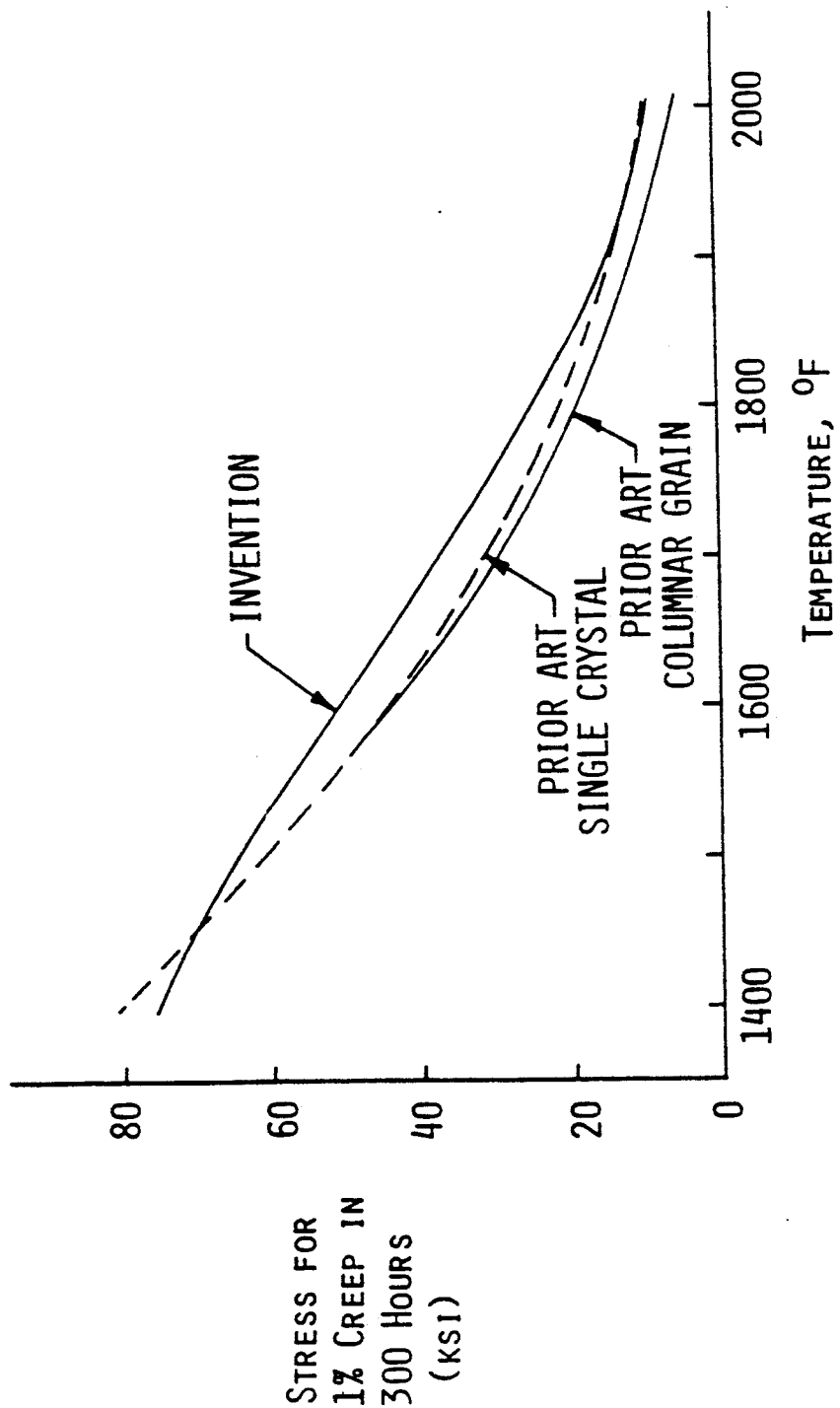

5,068,084

COLUMNAR GRAIN SUPERALLOY ARTICLES

DESCRIPTION

1. Technical Field

This invention relates to articles useful in gas turbine engines and to compositions useful for forming such articles. The compositions in question are nickel base superalloys which can be directionally solidified in the columnar grain form to provide articles having superior elevated temperature properties.

2. Background Art

Historical speaking single crystal materials have evolved from polycrystalline materials to columnar grain materials and then to single crystal materials. Initially, castings were made by allowing metal to solidify in an uncontrolled fashion to produce a microstructure comprised of a plurality of generally randomly oriented, equixed grains. Later it was found that by controlling the heat flow (in a uniaxial fashion) during solidification, the metal would solidify in the form of a plurality of elongated crystals whose axis of elongation extended in the direction of heat flow. This columnar grain material was found to have substantially improved high temperature mechanical properties over the prior art polycrystalline material as a consequence of the elimination of transverse grain boundaries (the columnar grain material displays its greatest high temperature strength advantage in the direction of grain elongation). The final development was made in the late 1960s when methods for producing single crystal articles of superalloy compositions were developed. Such single crystal superalloy articles are free from internal grain boundaries and display the best mechanical properties of any superalloy articles. In the sequence of evolution, the columnar grain material compositions were generally based on known prior art superalloy compositions which were slightly modified in order to provide optimized properties. Because single crystals were developed shortly after columnar grain materials were developed little effort was made to develop optimal alloys for columnar grain casting.

Since then much basic alloy knowledge has been developed in conjunction with the development of enhanced single crystal materials such as described in U.S. Pat. Nos. 4,116,723, 4,209,348, and 4,222,794. With such knowledge it now possible to return to the columnar grain casting technology and to develop a composition which will have greatly superior properties when solidified in columnar grain form to the properties of prior columnar grain materials. The benefits of the columnar grain casting process are basically economic since without the necessity to completely control the casting technique to provide a single crystal a considerable relaxation in casting parameters is possible, so that the casting process can be performed at a cost which is about one-third less than that of the single crystal casting process.

U.S. Pat. No. 3,526,499 describes nickel base superalloys which contain substantial amounts of solid solution strengtheners. The compositions of this patent contain a lower cobalt contents than those contemplated by the present invention and higher tantalum contents than those contemplated in the preferred form of the present invention. U.S. Pat. No. 3,711,337 describes a nickel base superalloy composition derived from an alloy known as Mar M-200 (a product of the Martin Marietta Corp.) which when directionally solidified in the columnar grain form provides articles having a good balance of mechanical properties for gas turbine engine applications. Articles made according to this patent are in wide spread commercial use and this composition is the standard commercial columnar grain directionally solidified material. U.S. Pat. No. 4,209,348 describes a composition which can be directionally solidified in single crystal form to provide substantially enhanced properties over that of the columnar grain materials described in the U.S. Pat. No. 3,711,337. Such single crystal articles are in widespread commercial use in applications where demanding conditions require material superior to those provided by U.S. Pat. No. 3,711,337. U.S. Pat. No. 4,388,124 describes a nickel base superalloy of a composition which can be directionally solidified to provide useable superalloy articles. The composition described in this patent contains less cobalt and more molybdenum than the compositions to be described in the present application.

The prior art has also described various eutectic materials which can be directionally solidified to provide strengthening by oriented second phases. Such prior art is not deemed pertinent to the present invention in which there are no aligned second phases.

DISCLOSURE OF INVENTION

The invention comprises an article made of a particular superalloy composition and the composition itself. The article has utility as a gas turbine engine component. Table I describes the broad and preferred compositions of the present invention. Material described in Table I is directionally solidified to provide a columnar grain article having the essential mechanical properties of prior art single crystal materials in combination with the economy afforded by the columnar grain solidification process.

The foregoing, and other features and advantages of the present invention will become more apparent from the following description and accompanying drawings.

BRIEF DESCRIPTION OF THE DRAWINGS

FIG. 2 illustrates 1% creep properties of invention material.

BEST MODE FOR CARRYING OUT THE INVENTION

Figure 1:
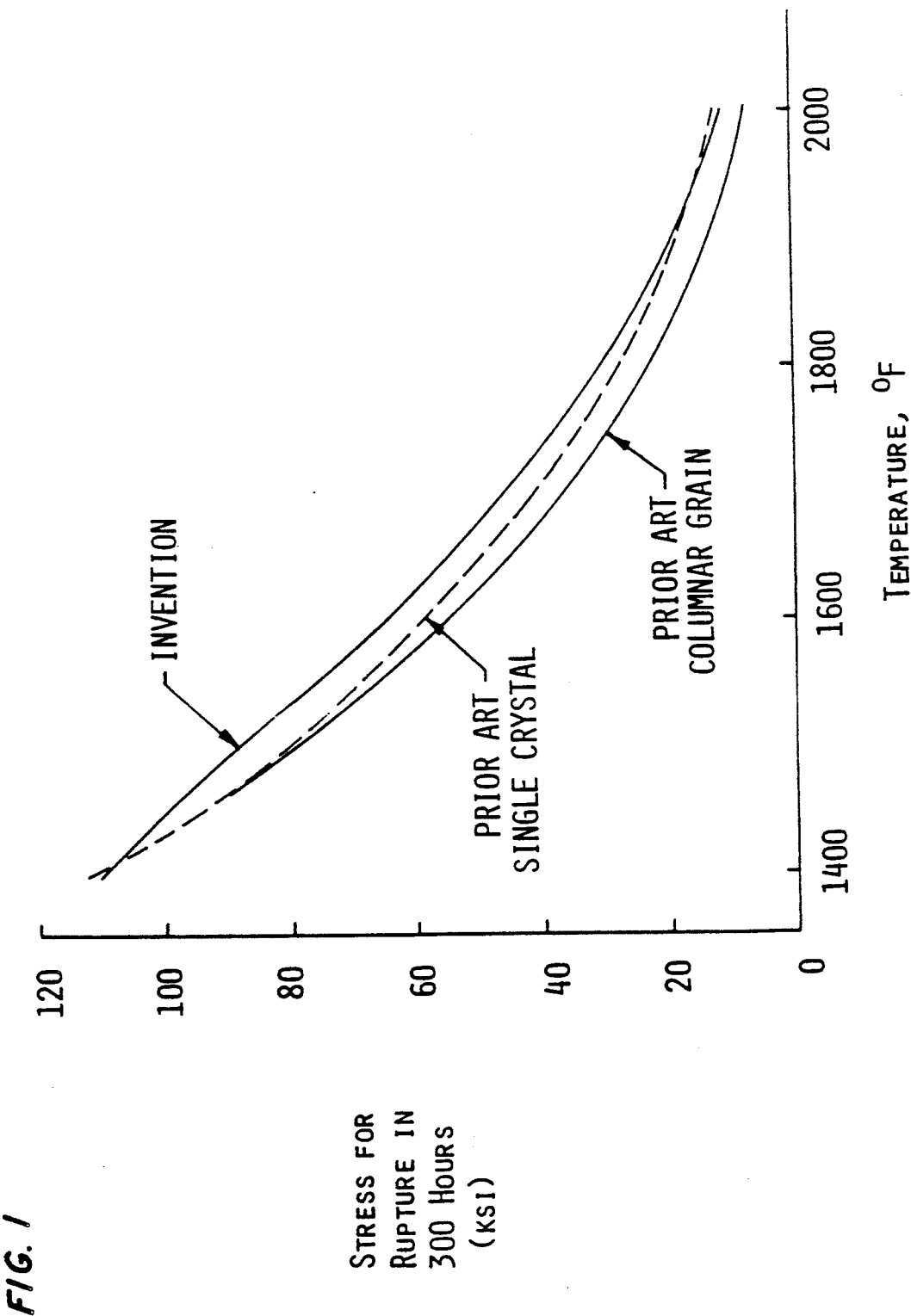
FIG. 1 illustrates stress rupture properties of invention material.

The broad and preferred compositions of the present invention are described in Table I. In addition, there are further compositional relationships which are preferably obeyed in order to obtain further benefits.

For enhanced castability, the ability to form defect-free columnar grain castings, the sum of the tungsten and rhenium should be less than about 10%, the hafnium should exceed about 0.5% and the carbon should exceed about 0.02%, the zirconium should exceed about 0.02% and the boron should exceed about 0.005%.

In order to insure that the article can be solution heat treated, i.e., to be certain that the gamma prime solvus temperature is less than the incipient melting temperature, the following equation should be obeyed: $70 + 5 Cr + 3 Co - (25 Ti + 7 Ta + 15 Al) > 0$. In order to insure long-term microstructual stability, freedom from deleterious phases even after extended exposure to elevated temperatures, the following equation should be obeyed: 1.5 Cr+0.3 Co+0.5 (W+Ta+Hf)+Mo+Re+3.3 Al +2.5 Ti<45. For superior hot corrosion resistance the following equation should be satisfied: 2 Cr−(2 Mo +W)>0. For superior high temperature oxidation resistance the following equation should be satisfied: 3 Al+Ta−(5 Ti+W)>12. Finally, for superior creep resistance the following equation should obeyed: 455 Al−37 Al$^2$+37 W−2W$^2$+22 Re+10(Mo+Ta) ≧1635. Through reference to the preceeding guidelines one faced with the task of selecting an alloy for a particular application will be able to determine how to formulate an alloy having the particular properties required.

One specific composition has a nominal composition of 6.4% Cr, 1.7% Mo, 6.6% W, 3% Re, 4.1% Ta, 5.9% Al, 12.6% Co, 0.012% B, 0.09% Zr, 0.1% C, 2.0% Hf, Bal. Ni. The general properties of this composition as compared with a commercially used single crystal material, (described in U.S. Pat. No. 4,209,348), and a commercial used columnar grain material, (described in U.S. Pat. No. 3,711,337), are set out below in Table II. In Table II the coating denoted "MCrAlY+Hf+Si" is a modified MCrAlY coating of the type described in U.S. Pat. No. 4,419,416 and the coating denoted "thin aluminide" is a coating of the type described in the U.S. Pat. No. 4,132,816. It can be seen from Table II that the present invention material has the properties necessary for use as a turbine airfoil in a gas turbine engine which are, with one exception, the equal of the prior art single crystal material. That exception is the oxidation performance when coated with a particular MCrAlY coating composition. However, when coated with other types of coatings the invention material is up to 900% better than the prior art substrate material with the same coating. With respect to the root attachment properties, Table II demonstrates that the invention material is not quite the equal of the prior art single crystal material. However, in the majority of applications the airfoil properties are the limiting properties and even where root attachment properties are limiting properties a redesign of the particular root geometry can generally solve the problem. Also shown in Table II is the comparison of the present invention properties with that of the standard prior art columnar grain material and it is seen that in all cases the invention material has superior properties to that of the columnar grain material.

Inasmuch as castings made by processes which result in columnar grain microstructures have costs which are about one-third less than those of casting made by processes which produce single crystal materials it is apparent that the present invention composition provides substantial costs benefits while permitting the achievement of mechanical properties in columnar grain materials which are effectively the equal of the properties of standard commercial single crystal material. The reduction in cost between single crystal casting and the columnar grain casting is largely the result of an increased yield of successful parts by the columnar grain process coupled with the less complex casting mold and shorter casting process cycle than that required to produce single crystal complements.

Casting techniques which produce columnar grain microstructures are described in U.S. Pat. Nos. 3,260,505, 3,405,220 and 3,538,981 which are incorporated herein by reference and casting techniques which can be used to produce single crystal components are described in U.S. Pat. Nos. 3,536,121 and 3,542,120 which are also incorporated herein by reference.

FIG. 1 is a creep rupture plot which shows the stress required to produce rupture in 300 hours as a function of temperature for 3 materials, the commercial single crystal material described in U.S. Pat. No. 3,711,337, the commercial columnar grain material described in U.S. Pat. No. 4,209,348 and the invention material. It can be seen that the invention material is stronger even than the single crystal material although the strength advantage over the single crystal material is not substantial. However the strength advantage of the invention material over the prior art columnar grain material is substantial and is significant in view of equivalent cost between the prior art columnar grain material and the invention columnar grain material.

FIG. 2 is a similar plot for creep strength in which the stress to produce 1% creep in 300 hours as a function of temperature is plotted and the same general relationship is observed between the prior art columnar grain material, the prior art single crystal material and invention material again confirming the general superiority of the invention material to both forms of prior art material.

Figure 3A:
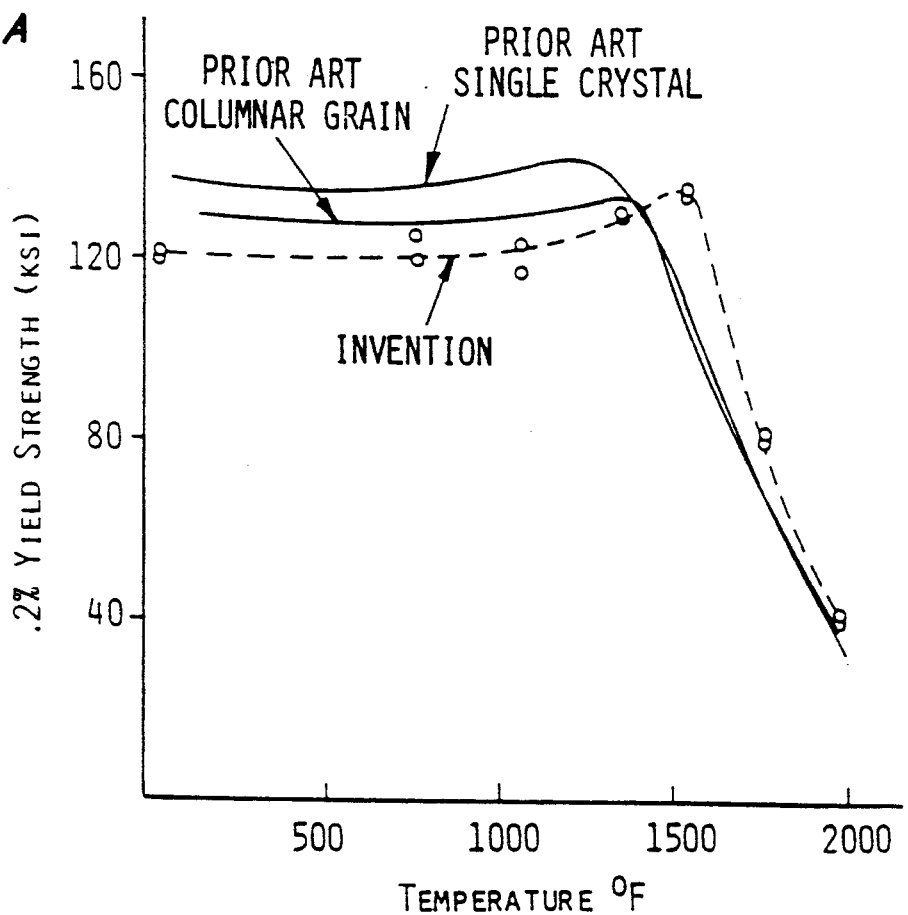
FIG. 3A illustrates 2% yield strength of invention material as a function of temperature.
Figure 3B:
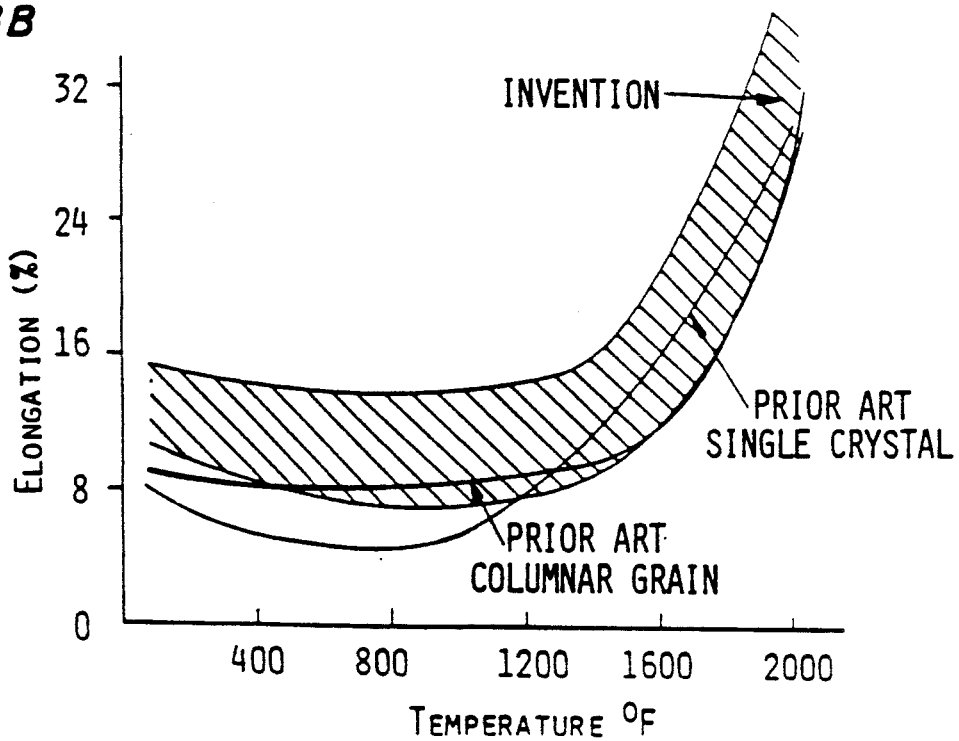
FIG. 3B illustrates elongation of invention material as a function of temperature.

FIGS. 3A and 3B present tensile properties of the various types of material as a function of temperature, FIG. 3A shows yield strength as a function of temperature and FIG. 3B shows elongation as a function of temperature. It is again apparent that the invention material is superior to both the prior art columnar grain material and the single crystal material in terms of tensile yield strength at elevated temperatures while in terms of elongation the invention material has an elongation which is superior to both the prior art materials.

Although this invention has been shown and described with respect to detailed embodiments thereof, it will be understood by those skilled in the art that various changes in form and detail thereof may be made without departing from the spirit and scope of the claimed invention.

TABLE I

|  | Broad | Preferred |
|---|---|---|
| Cr | 3–10 | 5–7 |
| Mo | 1.0–1.9 | 1.3–1.9 |
| W | 3–10 | 4–8 |
| Re | 0–5 | 1.5–3.5 |
| Ta | 0–8 | 3–5 |
| Al | 4–7 | 5–6.5 |
| Ti | 0–1.5 |  |
| Co | 12.1–16 | 12.5–15 |
| Cb | 0–2 |  |
| Ti + Cb |  | 0–1.0 |
| V | 0–1 |  |
| B | 0.005–0.25 | 0.005–0.025 |
| Zr | 0.02–0.12 | 0.02–0.12 |
| C | 0.03–0.20 | 0.03–0.12 |
| Hf | 0.5–3 | 1–2 |
| Ni | Bal. |  |

(1)Reactive Element (At Nos. 39–46, 57–78)

TABLE II

INVENTION PROPERTIES COMPARISON

| | Relative Life or Strength Advantage to Commercial | |
|---|---|---|
| Airfoil Properties | Single Crystal | Columnar Grain |
| Creep Strength | 1X | 3X |
| Thermal Fatigue Resistance | 1X | 2X |
| Oxidation Resistance | 1X | 4X |
| Uncoated | 0.65X | 3.5X |

TABLE II-continued
INVENTION PROPERTIES COMPARISON

| Airfoil Properties | Relative Life or Strength Advantage to Commercial | |
|---|---|---|
| | Single Crystal | Columnar Grain |
| MCrAlY + Hf + Si | 3X | 1X |
| Thin Aluminide | 9X | 2X |
| Hot Corrosion Resistance | 1X | 1X |
| High Cycle Fatigue Strength | 1X | +13 ksi |
| Root Attachment Properties | | |
| Tensile Strength | ≦1400° F. 0-15 ksi lower | 1X |
| | ≧1500° F. Similar | 1X |
| Low Cycle Fatigue Strength | −12 ksi | 1X |

We claim:

1. A superalloy composition suited for the fabrication of columnar grain articles which consists essentially of:
   3-10% Cr
   2.1-16.0% Co
   1.0-1.9% Mo
   3-10% W
   0-5% Re
   4-7% Al
   0-1.5% Ti
   0-8% Ta
   0.5-3.0% Hf
   0-2% Cb
   0-1% V
   0.02-0.12% Zr
   0.03-0.20% C
   0.005-0.25% B
   0-10% reactive element
   Balance Ni.

2. A composition as in claim 1 having incipient melting temperature sufficiently high to permit heat treatment, said composition satisfying the relationship $70 + 5\ Cr + 3\ Co - (25\ Ti + 7\ Ta + 15\ Al) \geq 0$.

3. A composition as in claim 1 having good hot corrosion resistance, and in which the following relationship is satisfied: $2\ Cr - 2(Mo + W) \geq 0$.

4. A composition as in claim 1 having good oxidation resistance and in which the following relationship is satisfied: $3\ Al + Ta - (5\ Ti + W) > 12\%$.

5. A composition as in claim 1 having good creep strength and in which the following relationship is satisfied: $455\ Al - 37Al^2 + 37W + 22\ Re + 10\ (Mo + Ta) \geq 1635$.

6. A superalloy composition suitable for fabrication of columnar grain superalloy articles consisting essentially of:
   5-7% Cr
   12.5-15% Co
   1.3-1.9% Mo
   1.5-3% Re
   4-8% W
   3-5% Ta
   1-2% Hf
   5-6.5% Al
   0-1.0% (Ti+Cb)
   0.02-0.12% Zr
   0.03-0.12% C
   0.005-0.025% B
   0-10% reactive elements
   Balance Ni.

7. A nickel base superalloy columnar grain article consisting essentially of:
   3-10% Cr
   12.1-16.0% Co
   1.0-1.9% Mo
   3-10% W
   0-5% Re
   4-7% Al
   0-1.5% Ti
   0-8% Ta
   0.5-3.0% Hf
   0-2% Cb
   0-1% V
   0.02-0.12% Zr
   0.03-0.20% C
   0.005-0.25% B
   0-10% reactive element
   Balance Ni.

8. A nickel base superalloy single crystal article consisting essentially of:
   5-7% Cr
   12.5-1.6% Mo
   1.3-1.6% Mo
   1.5-3% Re
   4-8% W
   3-5% Ta
   1-2% Hf
   5-6.5% Al
   0-1.0% (Ti+Cb)
   0.02-0.12% Zr
   0.03-0.12% C
   0.005-0.025% B
   0-10% reactive elements
   Balance Ni.

* * * * *